(12) United States Patent
König

(10) Patent No.: US 6,937,881 B2
(45) Date of Patent: Aug. 30, 2005

(54) WIRELESS RADIO TELEPHONE APPARATUS

(76) Inventor: Florian Meinhard König, Schellenbergstrasse 7, D-82110 Gemering (DE)

( * ) Notice: Subject to any disclaimer, the term of this patent is extended or adjusted under 35 U.S.C. 154(b) by 547 days.

(21) Appl. No.: 10/104,991

(22) Filed: Mar. 22, 2002

(65) Prior Publication Data

US 2002/0160726 A1 Oct. 31, 2002

(30) Foreign Application Priority Data

Mar. 22, 2001 (DE) .......................... 101 14 004
Jul. 6, 2001 (DE) .......................... 101 32 881

(51) Int. Cl.$^7$ ............................... H04B 1/38
(52) U.S. Cl. ............... 455/575.1; 455/550.1; 455/66.1; 455/575.7; 455/575.5; 455/90.3; 379/446
(58) Field of Search ................ 455/550.1, 66.1, 455/566, 575.1, 575.7, 575.5, 90.3, 300, 301, 114.1, 114.2, 106; 379/446

(56) References Cited

U.S. PATENT DOCUMENTS 5,925,847 A * 7/1999 Rademacher et al. ..... 174/35 R
6,421,016 B1 * 7/2002 Phillips et al. ............... 343/702
6,524,120 B2 * 2/2003 Zhao ........................... 439/95
6,624,432 B1 * 9/2003 Gabower et al. ......... 250/515.1
6,708,047 B1 * 3/2004 Miller et al. ............. 455/575.5

FOREIGN PATENT DOCUMENTS

| DE | 195 18 125 | 5/1995 |
| DE | 296 03 971 | 3/1996 |
| DE | 299 21 264 | 12/1999 |
| EP | 0 633 585 | 7/1994 |

OTHER PUBLICATIONS

Pletsch, Hans–Joachim, (1984) Excerpt from Franzis Elektronik–Nachschlagewerk, pp. 246–247.

* cited by examiner

*Primary Examiner*—Vivian Chin
*Assistant Examiner*—Sanh Phu
(74) *Attorney, Agent, or Firm*—Collard & Roe, P.C.

(57) ABSTRACT

A wireless telephone apparatus, in particular a mobile radio telephone or hand-set, a cordless telephone or the like, comprises an upper shell containing breakthroughs for a keyboard, and lower shell. In the area of the upper shell and the lower shell, there is at least one electrically and magnetically conducting screening element for screening the head of the use against EMV. According to one embodiment of the invention, the screening element is provided in the form of a lining of the upper shell or lower shell, for example in the form of an MU-metal sheet.

20 Claims, 3 Drawing Sheets

WIRELESS RADIO TELEPHONE APPARATUS

BACKGROUND OF THE INVENTION

1. Field of the Invention

The invention relates to a wireless two-way radio telephone apparatus. In particular, the invention relates to a two-way radio telephone or handy, a cordless telephone apparatus or the like, comprising an upper shell containing breakthroughs (or passages) for elements for operating the telephone, a lower shell, and an electrically conductive screening element for screening off EMV radiation generated by the electronics of the telephone apparatus.

2. The Prior Art

Such a device is known from European Patent No. EP 0 633 585 A1, which is designed in the form of a hand-held telephone. The upper shell of the mobile telephone is lined on the inner side with a screening element in the form of a electrically conductive metal sheet.

It has found in numerous test series that handy-type telephones, but also cordless telephones emit a substantial amount of interference radiation, and that the telephone apparatus known from EP 0 633 585 A1 is not suited for adequately suppressing the occurring interference radiation. Such interference radiation is typically in a frequency range of a few Giga-Hertz. The intensity of this interference radiation amounts to a few watts for a typical handy. Such interference radiation causes concern because the telephone apparatus here under discussion is used within the direct vicinity of the temple of the user. Therefore, there exists an urgent need for overcoming this drawback.

SUMMARY OF THE INVENTION

It is an object of the present invention to provide a wireless two-way radio telephone apparatus that, when used as designated on the ear of the user, will emit a distinctly lesser amount of low- and/or high-frequency interference radiation in the direction of the head, and in particular in the direction of the temple of the user, as compared to telephone apparatuses according to the state of the art.

This and other objects are accomplished by a wireless two-way radio telephone apparatus, in particular a mobile radio telephone or a handy, a cordless telephone (20) or the like, comprising an upper shell containing breakthroughs for operating elements, and a lower shell. There is an electrically conducting screening element for screening off EMV radiation generated by the electronics of the apparatus, wherein the screening element for screening off HF and/or LF-radiation is additionally magnetically conductive.

Accordingly, the invention is based on a combined electric and magnetic screening of HF and/or LF radiation of the two-way telephone apparatus in the form of at least one EMV screening element primarily on the side of the apparatus that comes to rest against the head of the user when used as intended. This side of the apparatus is normally the upper shell, which is provided with breakthroughs for operating elements, a microphone and a hearing capsule. However, this side can be established also by the lower shell provided with breakthroughs for a microphone and hearing capsule if the lower shell comes to rest against the head of the user. Finally, if the apparatus comprises an antenna projecting from the housing, which currently usually has the form of a short antenna stub, provision can be made for the EMV-screening element in the region of the two shells forming the housing.

The screening element may have different structures. According to a particularly preferred variation, the screening element contains a material composite consisting of electrically conductive material and a magnetically conductive material. MU-sheet material can be considered as magnetically conducting material. As an alternative to a composite comprising two metal sheets, it is possible also to use an electrically conductive metal sheet, such as an MU sheet with an electrically conductive metal coating, in order to form the screening element as defined by the invention. Furthermore, the respective metal sheet may be either solid or have breakthroughs or it may be perforated or provided in the form of a net-like structure. Such a material has a low weight and is particularly suited for being embedded in the plastic material of the upper or lower shell, or for lining the inner sides of the shells.

The screening element as defined by the invention may have different shapes. For example, it is within the scope of the present invention if the components of the apparatus emitting electromagnetic radiation, for example the HF transmitter/receiver part, is encapsulated in a targeted manner with the screening material. As an alternative or a supplementary measure, the screening element can be provided in the form of a screening element with a larger surface area located on the inner side of the upper and/or lower shell at least in the form of a partial lining. Or, at least one of said shells can be integrally formed together with such a screening element made of EMV-screening material.

MU-metal sheet is a preferred starting base for the different embodiments of the EMV screening element as defined by the invention.

According to a preferred embodiment of the invention, the usual antenna stub normally coated with a plastic cover, or generally an antenna element that may be provided in the interior of the shell housing of the wireless two-way radio telephone as well, can be included in the EMV-screening measure as defined by the invention. For this purpose, the antenna coating comprises the material, for example MU-metal sheet, of the screening element as defined by the invention for screening the head of the user against radiation. The screening element covers the antenna stub at least on the side of the head to such an extent that the function of the antenna is assured on the side facing away from the head, whereas effective EMV screening is made available on the side facing the head.

According to a preferred embodiment, the EMV screening element for screening the antenna cover generally has the shape of a "U", with the legs of the "U" extending parallel with the antenna stub, which has a transmitting/receiving angle of the antenna in the range of at least 90° to 170° on the side facing away from the head.

However, it is possible also to include in the EMV screening measure as defined by the invention an antenna that is completely arranged or integrated in the housing. For this purpose, the antenna comprises the screening element, e.g. MU metal sheet, said metal sheet covering the antenna on the side of the head to the extent that the antenna is assured to function on the side facing away from the head, whereas optimal EMV screening exists on the side facing the head.

The invention essentially proposes an EMV screening measure for low-frequency and/or high-frequency electric and magnetic fields based on at least one suitably structured screening element such as, an electrically and magnetically conductive element consisting of a material composite. This measure, which is effective already per se, can still be optimized by providing a device for the application of a counter field with low-frequency and/or high-frequency field components for at least partly erasing the electromagnetic field generated by the electronics of the apparatus. Such a device is coupled to the metal sheet of the upper shell and/or the lower shell and/or the antenna stub or the antenna in order to distinctly reduce the field proportion of the energy radiation of the speaking apparatus in the direction of the head of the user. This electronic screening measure has to be equated in terms of communications technology to a measure for changing the directional effect of the transmitting/receiving antenna in that the temple side of the apparatus (side with the operating elements of the telephone/handy) is designed as the zone with the lowest high-frequency radiation.

The device for the application of an electromagnetic counter field advantageously comprises a signal generation and/or feeding unit for generating an electromagnetic counter field that is coupled to/applied to/acted upon by the MU metal sheet via at least one $\lambda/x$-miniature dipole antenna (x stands for a positive integer).

The device for the application of an electromagnetic counter field advantageously comprises a measuring and controlling loop containing the $\lambda/x$ miniature dipole antenna with a probe for measuring the magnetic field generated by the electronics of the apparatus. In this way, an electronically self-regulating active (not passive) screening measure is made available that is adapted to the actual capacity of the electronics.

The control loop arrangement is optimized by linking the signal generating and feeding unit with the measuring and controlling loop via a signal processor unit. Such a linkage preferably comprises a means for signal/phase synchronization, and said means advantageously sets a phase rotation of the signals by 180° for the signal packet/phase synchronization.

BRIEF DESCRIPTION OF THE DRAWINGS

Other objects and features of the present invention will become apparent from the following detailed description considered in connection with the accompanying drawings. It is to be understood, however, that the drawings are designed as an illustration only and not as a definition of the limits of the invention.

In the drawings, wherein similar reference characters denote similar elements throughout the several views.

DETAILED DESCRIPTION OF THE PREFERRED EMBODIMENT

Figure 1:
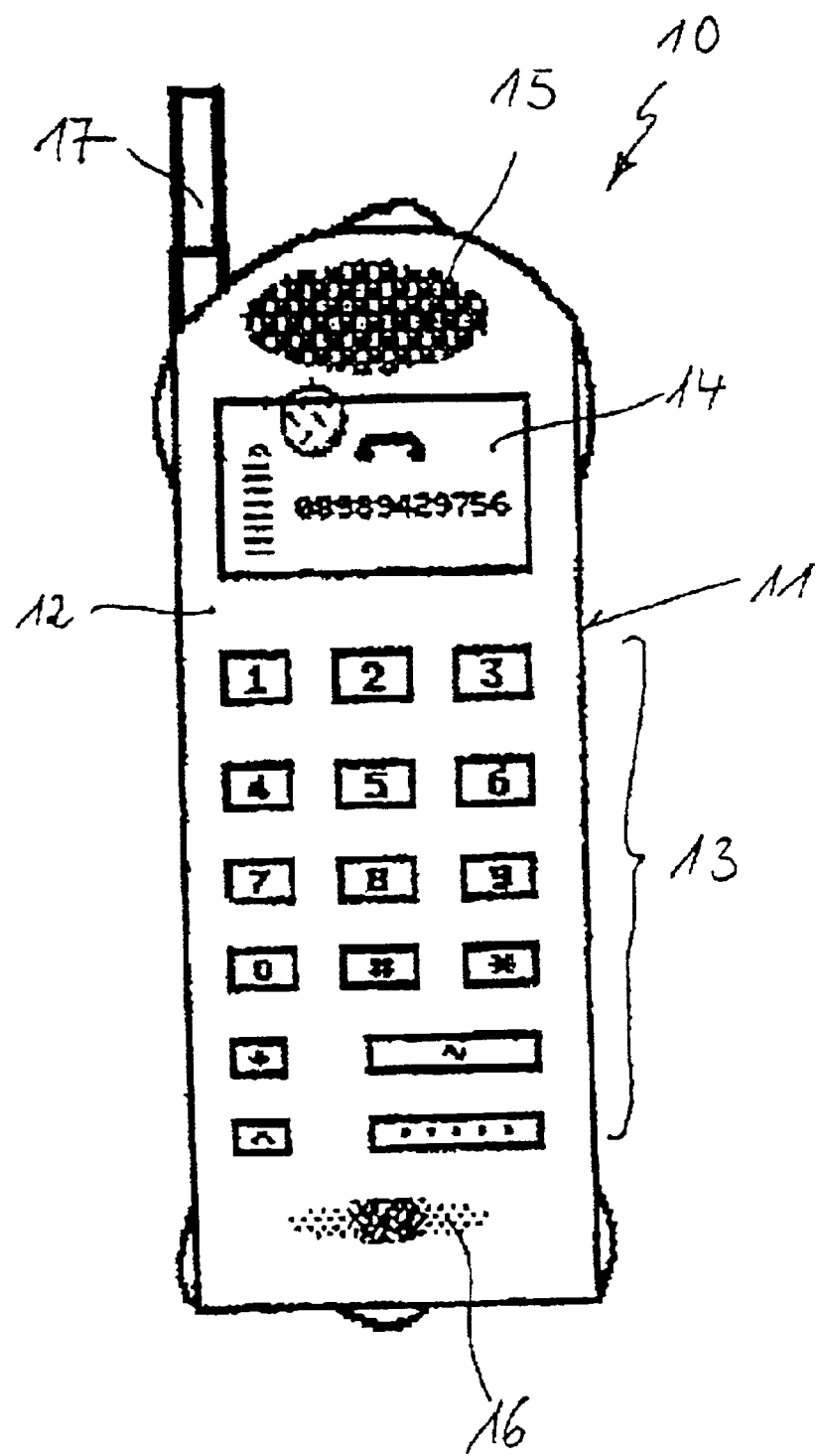
FIG. 1 shows a hand-set with an EMV screening element in the form of an electrically and magnetically conducting housing made of a metal sheet composite.

Referring now in detail to the drawings and, in particular, FIG. 1 shows a hand-set 10, which represents an example of the two-ray radio telephone here under discussion. The hand-set 10 comprises a housing 11 with an upper shell 12 and a lower shell not shown in FIG. 1 (see the lower shell 21 of the cordless telephone according to FIG. 2, or the cross-sectional view according to FIG. 4). The upper shell 12 comprises numerous recesses or breakthroughs for various elements such as a keyboard with different keys, including, among others, a ten-key board for selection purposes or for command or data input, whereby the keyboard as a whole is denoted by the reference numeral 13. Above the keyboard 13, there is a rectangular breakthrough for a display 14. The raster-like breakthroughs 15 are provided above display 14 for a loudspeaker arranged below the upper shell 12. The pendant of said raster-like breakthroughs is located below the keyboard 13 in the form of the raster-like breakthroughs 16 for at least one speaking microphone.

The hand-set 10 shown in FIG. 1, furthermore, comprises an antenna in the form of a stub-like antenna that is covered by a plastic sleeve 17.

Figure 4:
FIG. 4 shows a cross section through the lower shell of the housing of FIG. 1 for the purpose of explaining a structure composed of an electrically and magnetically conducting metal sheet composite.

According to the invention, at least the side of the housing 11 that comes to rest in the region of the temple of the head of the user is formed by the upper shell 12 of the hand-set 10 for screening against the electromagnetic field. In the embodiments shown in FIGS. 1, 2 and 4, the upper and lower shells of the housing 11 are formed by electrically and magnetically conducting material all the way through. As shown in FIG. 4, lower shell 100 consists of (as does, for example the upper shell) a composite of an electrically conducting metal sheet 101 and a magnetically conducting metal sheet 102 such as, for example MU sheet.

Alternatively, upper shell 12 may consist of plastic as it usually did until now, and may be lined on the inner side with electrically and magnetically conducting screening material at least partially in those areas that emit electric-magnetic radiation to a particularly high degree, which can be easily determined by measurements. So that this measure can be implemented at a later time as well, the upper shell consisting of, for example plastic, is formed thinner than it usually is, and the remaining available thickness of the upper shell is at least partly covered with MU metal sheet. According to the invention, the antenna stub is included in the electric-magnetic screening measure as well. This is accomplished, for example by covering sleeve 17 of the antenna stub with MU sheet metal at least on the side facing the ear of the user. The corresponding portion of the covering sleeve generally has the shape of a "U" with the legs of the "U" extending parallel with the antenna stub or its covering sleeve 17, which assures a radiation reception angle of the antenna on the side facing away from the head in the range of at least 90° to about 170°. This screening measure can also be used with an antenna integrated in the housing 11 of the hand-set 10.

Figure 2:
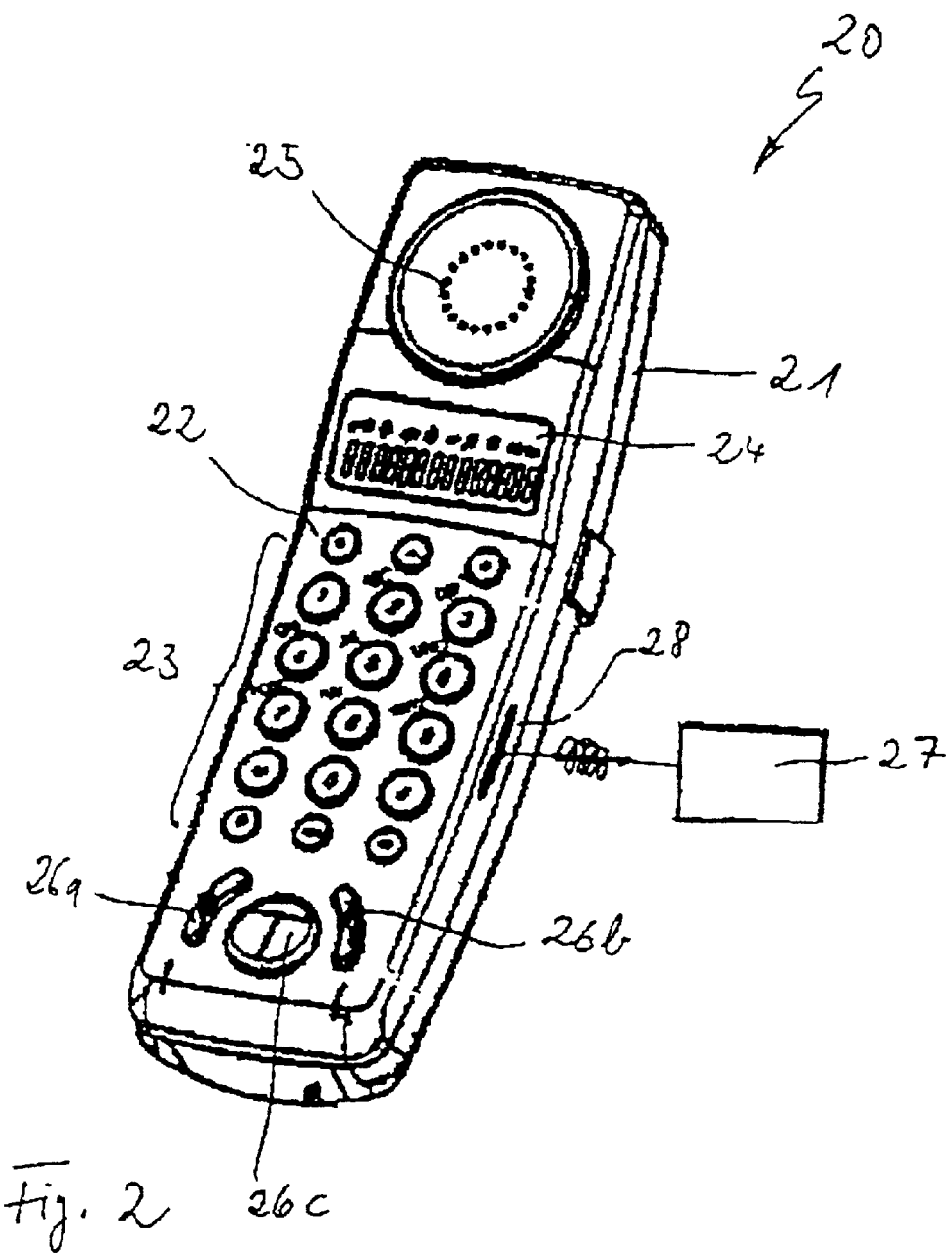
FIG. 2 shows the hand-set apparatus of a cordless telephone with a screened housing according to FIG. 1, which additionally incorporates an electronic screening measure in the form of a device for generating a counter field.
Figure 3:
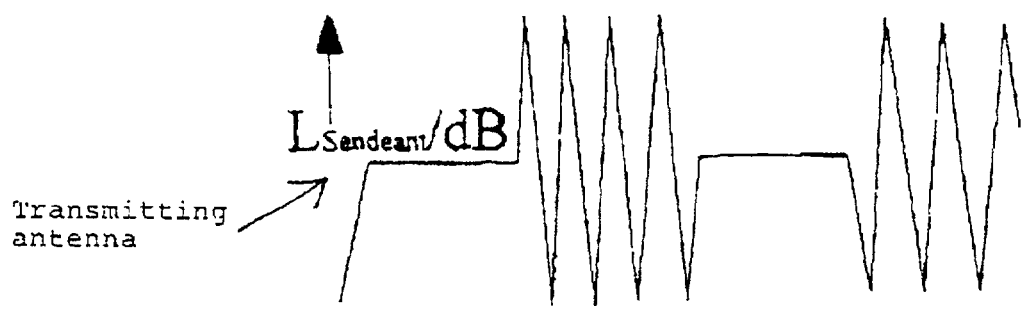
FIG. 3 shows a diagram of the time curve of the amplitude of the electromagnetic field generated by the hand-held apparatus according to FIGS. 1 and 2, and the time curve of the amplitude of the electromagnetic counter field applied thereto.
Figure 3:
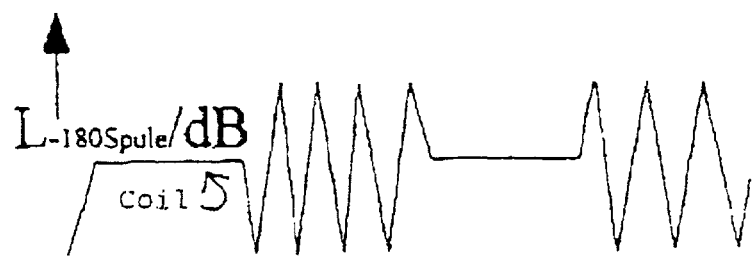

FIG. 2 shows a variation of the wireless two-way radio apparatus of a cordless telephone herein under discussion. This two-way radio apparatus, which is generally denoted by reference numeral 20, has a structure similar to the apparatus shown in FIG. 1, comprising the lower shell 21, an upper shell 22, and numerous breakthroughs for a keyboard 23 and a display 24. Furthermore, in the upper area of the telephone housing, in the upper shell 22, there are breakthroughs distributed in a circle like a raster for the passage of the sound of the loudspeaker located there. The breakthroughs 26a, 26b and 26c for the microphone are located at the lower end of the upper shell 22.

The upper shell 22 is lined with MU-metal sheet in a similar way, or consists of said material as in connection with the apparatus according to FIG. 1. Furthermore, the antenna, which is not shown but installed within the housing, is accordingly lined with MU metal sheet in the direction of the front side of the apparatus 20 facing the head of the user, without obstructing the reception/transmission of the antenna.

In addition to the screening measure based on MU-metal sheet or the respective measures, FIG. 2 shows an active (highest frequency) electronic field-screening measure in the form of at least one device 27 for the application of a electromagnetic counter field to the metal sheet of the upper shell 22 in order to compensate the electromagnetic field produced by the electronics of the apparatus 20 at least in part. The device 27 is shown schematically located outside of the housing or upper and lower shells. However, in an embodiment that relates to common practice, the device is integrated in the apparatus 22 on the surface of the housing.

The device comprises a signal detection/generation and/or signal feeding unit, which is not shown in detail, and which serves for producing the electromagnetic counter field, and which is coupled to/applied to/acted upon by the metal sheet via at least one isolated λ/x miniature dipole antenna.

The device 27 for the application of an electromagnetic counter field comprises (also not shown) a measuring and controlling loop for the signal generation and feeding unit, with a signal processor unit for linking the signal generation and feeding unit with the measuring and controlling loop. The linkage of the two units preferably comprises a means for the signal set/phase synchronization, which preferably supplies a phase shift of the signal set by 180°. The standardized, specified pulsing (GSM, UMTS) of the speech signal sets of 100 Hz (DECT-pulsing) in the case of a cordless telephone, or of 217 Hz in the case of a hand-set (900 or 1800 MHz) is taken into account in this way. The signal sets are introduced phase-shifted into the MU metal sheet, for example by the upper shell preferably via a plurality of the λ/x miniature dipole antennas 28. This may take place so that a portion of the signals sets modulated up with the 900-MHz carrier and admitted phase-shifted into the λ/x miniature dipole antenna. This feed, however, takes place with reduced intensity, so that if the antenna field signal amplitudes of the useful signal and the compensation cancellation signal overlap, amplitude erasure is made available as completely as possible near the head of the user, which is known to the expert in the field. These measures, therefore, need not to be addressed here in detail.

The MU-metal sheet that may form the upper shell of a hand-set (see FIGS. 1 and 2) is acted upon by an electromagnetic counter field in favor of the screening measure explained above. The phase of the electromagnetic counter field is shifted by 180° in relation to the electromagnetic field emitted by the hand-set. In other words, the MU metal sheet and the λ/x transmission antenna or several of such antennas jointly form a high-frequency transmission antenna with a relatively large surface area for applying electromagnetic counter fields. Said transmission antenna is supplied with a weak highest-frequency or high-frequency compensation signal for producing the electromagnetic counter field via the device 27.

According to a further embodiment, the transmission antenna with the large surface area and the one or more λ/x antennas are jointly subjected to a signal intensity detection process in the device 27. The partial signal intensities detected in this process of the diverse antennas form the basis for a high-frequency compensation signal (electromagnetic counter field) to be generated in the device 27, which is applied to the respective antennas, so that at the temple of the person using the hand-set, a high-frequency signal intensity minimum is adjusted—viewed over the surface area—within a time frame of milliseconds to seconds. Said adjustment is based on field lines of different intensities in different positions of the hand-set or of the temple of the user.

If, for example, the hand-set is operated with a free speaking device which the user hods in his hand, the result are different control processes that, however, always take place on toward the keyboard side with minimal high-frequency signal intensity. In the wavelength near-field range, the result is mixing or overlapping of fields of the different transmitting antennas, whereby the transmitting antenna with the large surface area in the form of the MU metal sheet takes the largest share in view of the directional characteristic.

Accordingly, while only a few embodiments of the present invention have been shown and described, it is obvious that many changes and modifications may be made thereunto without departing from the spirit and scope of the invention.

What is claimed is:

1. A wireless two-way radio telephone apparatus, comprising:
   an upper shell containing breakthroughs for operating element;
   a lower shell connected to said upper shell;
   an electrically conducting screening element located within a region of one of said upper shell and lower shell for screening off EMV radiation generated by the electronics of said apparatus, said screening element being magnetically conductive for screening off HF and LF-radiation; and
   a device for applying to the screening element a counter field with low- and high-frequency field components for at least partially erasing a field produced by electronics of the apparatus in order to additionally reduce a field component of energy radiation of a speaking apparatus in the direction of the head of the user.

2. The wireless two-way mobile radio telephone apparatus according to claim 1, wherein the screening element contains a composite consisting of electrically conducting material and magnetically conducting material.

3. The wireless two-way mobile radio telephone apparatus according to claim 2, wherein the screening element contains a composite consisting of electrically conducting and magnetically conducting metal sheet.

4. The wireless two-way mobile radio telephone apparatus according to claim 1, wherein the screening element contains MU metal sheet.

5. The wireless two-way mobile radio telephone apparatus according to claim 4, wherein the MU metal sheet is provided with an electrically conducting metal coating.

6. The wireless two-way mobile radio telephone apparatus according to claim 1, wherein the screening element comprises solid screening material.

7. The wireless two-way mobile radio telephone apparatus according to claim 1, wherein the screening element is a net-like or perforated element.

8. The wireless two-way mobile radio telephone apparatus according to claim 1, wherein the screening element is arranged in an area of components of the apparatus emitting electromagnetic radiation.

9. The wireless two-way mobile radio telephone apparatus according to claim 1, wherein the screening element extends over an entire surface area of at least one of the upper shell and lower shell up to the breakthroughs.

10. The wireless two-way mobile radio telephone apparatus according to claim 1, wherein the screening element extends over a recessed edge of the upper shell and lower shell.

11. The wireless two-way mobile radio telephone apparatus according to claim 1, wherein the upper shell and lower shell consist of a material of the screening element.

12. The wireless two-way mobile radio telephone apparatus according to claim 1, further comprising an antenna element projecting beyond the upper shell and lower shell and covered in plastic, and further comprising a cover of the antenna element comprising material of the screening element, said cover covering the antenna stub projecting from the housing on a head side to such an extent that function of the antenna is assured on a side facing away from the head.

13. The wireless two-way mobile radio telephone apparatus according to claim 1, further comprising an antenna completely arranged in the housing, wherein the screening element extends in an area of the antenna for EMV-screening the head of the user and covers the antenna on a side of the head to such an extent that function of the antenna on a side facing away from the head is assured.

14. The wireless two-way mobile radio telephone apparatus according to claim 1, wherein the device comprises a signal detection generation and signal feeding unit for producing an electromagnetic counter field, said unit being coupled to the MU-metal sheet on one or both sides via at least one insulated $\lambda/x$ miniature dipole antenna.

15. The wireless two-way mobile radio telephone apparatus according to claim 14, wherein the device comprises a measuring and controlling loop containing the $\lambda/x$ miniature dipole antenna and a probe or antenna for measuring total electromagnetic field produced by and resulting from electronics of the apparatus on a side facing the head.

16. The wireless two-way mobile radio telephone apparatus according to claim 14, wherein the signal detection generation and signal feeding unit is linked with the measuring and controlling loop via a signal processor unit.

17. The wireless two-way mobile radio telephone apparatus according to claim 16, wherein a linkage between the signal detection generation and signal feeding unit comprises a means for highest-frequency signal/phase synchronization.

18. The wireless two-way mobile radio telephone apparatus according to claim 17, wherein a phase shift by 180 degrees is made available for the counter field by the means for signal set/phase synchronization.

19. The wireless two-way mobile radio telephone apparatus according to claim 18, wherein the screening element contains MU-metal sheet and wherein the device takes into account the MU-metal sheet as transmission antennas with large surface areas when producing the electromagnetic counter field.

20. The wireless two-way mobile radio telephone apparatus according to claim 19, characterized in that in addition to the antenna with the large surface area, the device includes in the generation of the electromagnetic counter field a $\lambda/x$ miniature dipole antenna in the form of a multitude of dipole antennas.

* * * * *